(12) United States Patent
Cress et al.

(10) Patent No.: US 12,740,328 B2
(45) Date of Patent: Sep. 15, 2026

(54) METHOD OF INDUCING EXCHANGE BIAS BY SINGLE STEP IRRADIATION IN A SINGLE FeRh THIN FILM FOR USE IN MAGNETIC TUNNEL JUNCTIONS

(71) Applicant: The Government of the United States of America, as represented by the Secretary of the Navy, Arlington, VA (US)

(72) Inventors: Cory D. Cress, Springfield, VA (US); Olaf M.J. van 't Erve, Falls Church, VA (US); Steven P. Bennett, Owings, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 560 days.

(21) Appl. No.: 18/129,848

(22) Filed: Apr. 1, 2023

(65) Prior Publication Data

US 2023/0329124 A1 Oct. 12, 2023

Related U.S. Application Data

(60) Provisional application No. 63/327,852, filed on Apr. 6, 2022.

(51) Int. Cl.
*H10N 50/85* (2023.01)
*H10B 61/00* (2023.01)
(Continued)

(52) U.S. Cl.
CPC ............. *H10N 50/85* (2023.02); *H10B 61/00* (2023.02); *H10N 50/01* (2023.02); *H10N 50/10* (2023.02)

(58) Field of Classification Search
CPC ........ H10N 50/85; H10N 50/01; H10N 50/10; H10B 61/00
(Continued)

(56) References Cited

U.S. PATENT DOCUMENTS 7,123,453 B2 * 10/2006 Hasegawa .............. B82Y 10/00
11,074,950 B2 7/2021 van 'T Erve
(Continued)

OTHER PUBLICATIONS

Fan et al. Ferromagnetism at the interfaces of antiferromagnetic FeRh epilayers Phys. Rev. B 82, 184418—Published Nov. 12, 2010 (Year: 2010).*
(Continued)

*Primary Examiner* — Jami Valentine Miller
(74) *Attorney, Agent, or Firm* — US Naval Research Laboratory; Stephen T. Hunnius

(57) ABSTRACT

A single layer of metamagnetic material with exchange bias comprising a single layer of FeRh, wherein the single layer of FeRh comprises ion irradiation, wherein the single layer of FeRh comprising ion irradiation is an exchange bias surface layer, and wherein the single layer of FeRh comprises an interface between a ferromagnetic (FM) region and an antiferromagnetic (AFM) region. A method to create a FM/AFM junction in a single layer of FeRh, comprising the steps of providing a layer of FeRh film, wherein the layer of FeRh film is an antiferromagnetic (AFM) film, implanting ions into the top portion of the FeRh film, creating via the step of implanting ions a ferromagnetic (FM) region in the top region, maintaining the antiferromagnetic (AFM) region of the bottom portion, and creating a FM/AFM junction in the single layer of FeRh.

13 Claims, 11 Drawing Sheets

(51) Int. Cl.
*H10N 50/01* (2023.01)
*H10N 50/10* (2023.01)

(58) Field of Classification Search
USPC .......................................................... 257/421
See application file for complete search history.

(56) References Cited

U.S. PATENT DOCUMENTS 11,195,644 B2* 12/2021 Wang .................... C23C 14/185
2009/0226764 A1* 9/2009 Srinivasan ............. G11B 5/674 204/192.15
2010/0213134 A1* 8/2010 Campbell ................. C02F 1/42 210/285
2011/0250696 A1* 10/2011 Rajchel .................... B01J 49/06 423/371
2016/0009545 A1* 1/2016 Fuji ....................... G01L 9/0044 257/419
2016/0258824 A1* 9/2016 Fuji ......................... G01L 1/125
2018/0308535 A1* 10/2018 Shiokawa ........... G11C 11/1675
2020/0395156 A1* 12/2020 Bennett ................. H01F 10/002
2022/0323900 A1* 10/2022 Johnson .................... C25B 9/23
2023/0320230 A1* 10/2023 Debashis ............... H10N 50/80 257/421
2023/0329124 A1* 10/2023 Cress ..................... H10N 50/10 257/421

OTHER PUBLICATIONS

Bennett, S. P., et al. "Giant controllable magnetization changes induced by structural phase transitions in a metamagnetic artificial multiferroic." Scientific Reports 6.1 (2016): 22708.

Bennett, S. P., et al. "Magnetic order multilayering in FeRh thin films by He-Ion irradiation." Materials Research Letters 6.1 (2018): 106-112.

Bennett, S. P., et al. "Magnetic order multilayering in FeRh thin films by He-Ion irradiation." Materials Research Letters 6.1 (2018): 106-112.

* cited by examiner

METHOD OF INDUCING EXCHANGE BIAS BY SINGLE STEP IRRADIATION IN A SINGLE FeRh THIN FILM FOR USE IN MAGNETIC TUNNEL JUNCTIONS

REFERENCE TO RELATED APPLICATION

This application is a non-provisional of, and claims priority to and the benefits of, U.S. Provisional Patent Application No. 63/327,852 filed on Apr. 6, 2022, the entirety of which is herein incorporated by reference.

BACKGROUND

This disclosure describes and demonstrates: (1) A method of inducing exchange bias by single step irradiation in a single FeRh thin film; (2) A method that can reduce or enhance the temperature needed to set the exchange field; (3) A method for pinning a ferromagnetic (FM) layer to an antiferromagnetic (AFM) layer while eliminating Mn diffusion; and (4) A process that uses ion irradiated thin films of metamagnetic materials, such as FeRh alloys, as the exchange bias layer in a magnetic tunnel junction, reducing the total number of layers and complexity of current technology.

Magnetic random-access memory (MRAM) is predicted to be a 5.6 billion dollar industry by the year 2025.

The appeal of magnetic-based memory is the built-in non-volatility of the memory state using the magnetization of a magnetic layer.

Furthermore, magnetic memory is considered to have an unlimited amount of memory cycles, is scalable, embeddable, and fast. All of these features are recognized by industry as promising metrics to meet the growing need for memory solutions in the future. Indeed, MRAM is currently available commercially, and major players are investing in the technology.

MRAM technology is possible because of the magnetic tunnel junction (MTJ) added during back end of line (BEOL) processing.

This MTJ is a complex heterostructure that changes its resistance more than 100% depending on the magnetization direction of the free magnetic layer and the fixed magnetic layer.

The fixed magnetic layer, where the magnetization is fixed in one direction, is typically a complex heterostructure consisting of an antiferromagnetic layer (typically Mn based alloys) and synthetic antiferromagnet (a FM/Nonmagnetic (NM)/FM) heterostructure designed to minimize the dipole moment at the tunnel junction. This fixed layer stack, adds height, complexity and the possibility of detrimental Mn diffusion in the MTJ.

Films of FeRh are known to exhibit a unique AFM to ferromagnetic FM transition slightly above room temperature, known as the metamagnetic phase transition. FeRh is a unique material that changes its intrinsic magnetic order at an ambient temperature range of 280 K to 425 K. This highly unusual metamagnetic transition offers the possibility to switch between the two magnetic phases by external perturbation, such as temperature or ion irradiation, offering completely new avenues for magnetism-based device design.

SUMMARY OF DISCLOSURE

Description

This disclosure teaches and demonstrates: (1) A method of inducing exchange bias by single step irradiation in a single FeRh thin film; (2) A method that can reduce or enhance the temperature needed to set the exchange field; (3) A method for pinning a ferromagnetic (FM) layer to an antiferromagnetic (AFM) layer while eliminating Mn diffusion; and (4) A process that uses ion irradiated thin films of metamagnetic materials, such as FeRh alloys, as the exchange bias layer in a magnetic tunnel junction, reducing the total number of layers and complexity of current technology.

This disclosure concerns a method to create a FM/AFM junction in a single layer of FeRh by implanting the surface of an FeRh film, which also achieves exchange bias of the FM region.

This disclosure concerns a method to achieve a sharp interface between the FM and AFM regions of the FeRh film.

This disclosure concerns near-interfacial, pinned uncompensated moments or centers. These pinned centers or moments then cause full regions near the interface to align with the FM layer forming AFM domains.

This disclosure teaches solutions to long-standing problems and concerns a method to utilize low-energy heavy ions that have a very short range in the material and therefore very little straggle.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure teaches and describes and demonstrates: (1) A method of inducing exchange bias by single step irradiation in a single FeRh thin film; (2) A method that can reduce or enhance the temperature needed to set the exchange field; (3) A method for pinning a ferromagnetic (FM) layer to an antiferromagnetic (AFM) layer while eliminating Mn diffusion; and (4) A process that uses ion irradiated thin films of metamagnetic materials, such as FeRh alloys, as the exchange bias layer in a magnetic tunnel junction, reducing the total number of layers and complexity of current technology.

This disclosure concerns a method to create a FM/AFM junction in a single layer of FeRh by implanting the surface of an FeRh film, converting it to FM and which also achieves exchange bias of the FM/AFM interfacial region upon field cooling from above the FeRh metamagnetic transition temperature.

This disclosure concerns a method to achieve a sharp interface between the FM and AFM regions of the FeRh film.

This disclosure teaches solutions to long-standing problems and concerns a method to utilize low-energy heavy ions that have a very short range in the material and therefore very little straggle.

Figure 1:
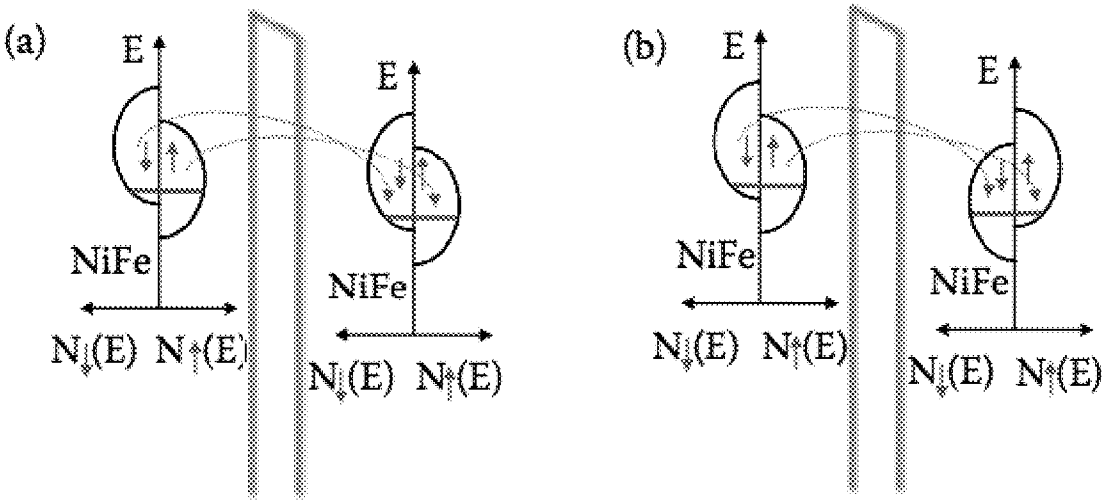
FIG. 1 illustrates a simplified diagram of tunneling from ferromagnet to ferromagnet. Magnetization is parallel. One spin species tunnels from a large density of states to a large density of states, and a low tunnel resistance is measured. Magnetizations antiparallel, both spin species tunnel from a large (small) density of states to a small (large) density of states, and a high tunnel resistance is measured.

Current state of the art MTJs use two magnetic layers separated by a thin insulator. Transport across this thin insulator is possible by tunneling, a purely quantum mechanics-based effect. Tunneling across a thin insulator depends critically on the density of states (DOS) available on both sides of the tunnel barrier. Since the DOS at the FM/insulator interface is spin dependent, the tunneling process becomes spin orientation dependent. When the magnetic layers are aligned with their magnetizations in parallel, majority electrons that have a large DOS in the left electrode (FIG. 1) can readily tunnel to the large DOS of the majority state of the right electrode. However, when the magnetic electrodes have their magnetizations anti-parallel, the majority electrons with a large DOS can only tunnel to the minority states of the right electrode, which has a much smaller DOS. Thus, the tunnel resistance is increased by this spin-dependent effect. Tunnel magnetoresistance effects of over 200% have been observed in Fe/MgO/Fe tunnel barriers. This type of MTJ is now the major component in read-heads for hard disks and they are the memory elements of choice in commercially available MRAM.

Figure 2:
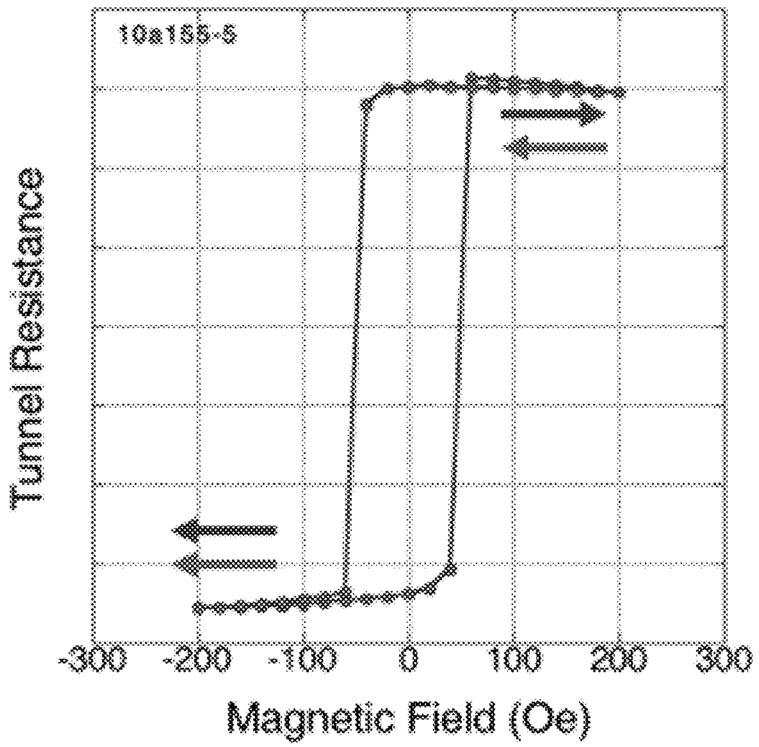
FIG. 2 illustrates Resistance vs. Magnetic field of a MTJ, minor loop is shown. Also shown is an illustration of a typical MTJ stack including the antiferromagnetic layer (PtMn) and a synthetic antiferromagnetic heterostructure CoFe/Ru/CoFeB.
Figure 2:
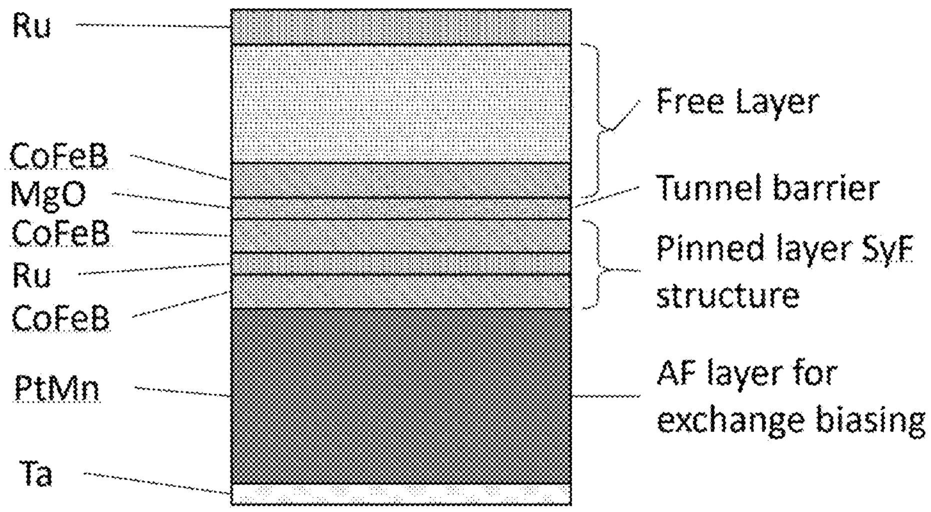

As discussed above, a magnetic tunnel junction has two states, parallel and anti-parallel, with two significantly different resistances, as shown in FIG. 2.

For MRAM elements it is desirable to have a fixed magnetic layer (pinned layer) where the magnetization always points in a predefined direction and a free magnetic layer, where the magnetization can be switched to point parallel or antiparallel to the fixed layer. The switching of the free magnetic layer is typically done electrically (field free) by using spin transfer torque.

Pinning a FM layer in a fixed direction is typically done with a stack of disimilar materials, (FIG. 2). One starts with a metallic colinear AFM layer, which is typically a Mn based alloy such as PtMn. This is followed by a synthetic AFM heterostructure, such as, CoFe/Ru/CoFeB. In order to set the magnetization direction (exchange field) of the pinned layer, a high temperature anneal of the full stack in a magnetic field is needed. The annealing temperature needs to be above the blocking temperature of the AFM layer, which is intrinsic to the alloy used.

Reliability issues at these annealing temperatures arise from the Mn diffusion into the stack.

Secondly, a full Synthetic AFM or FM heterostructure is needed to minimize dipolar interaction between the pinned layer and the free layer.

Any additional layer adds to complexity and the overall height of the device, both are important technological constraints and problems to overcome.

Example 1

FeRh

Films of FeRh have long been known to exhibit a unique AFM to FM transition slightly above room temperature, referred to as the metamagnetic phase transition. FeRh is a unique material that changes its intrinsic magnetic order at an ambient temperature of 360 K. This highly unusual metamagnetic transition offers a possibility to switch between the two magnetic phases by external perturbation, such as temperature or ion implantation.

Figure 3:
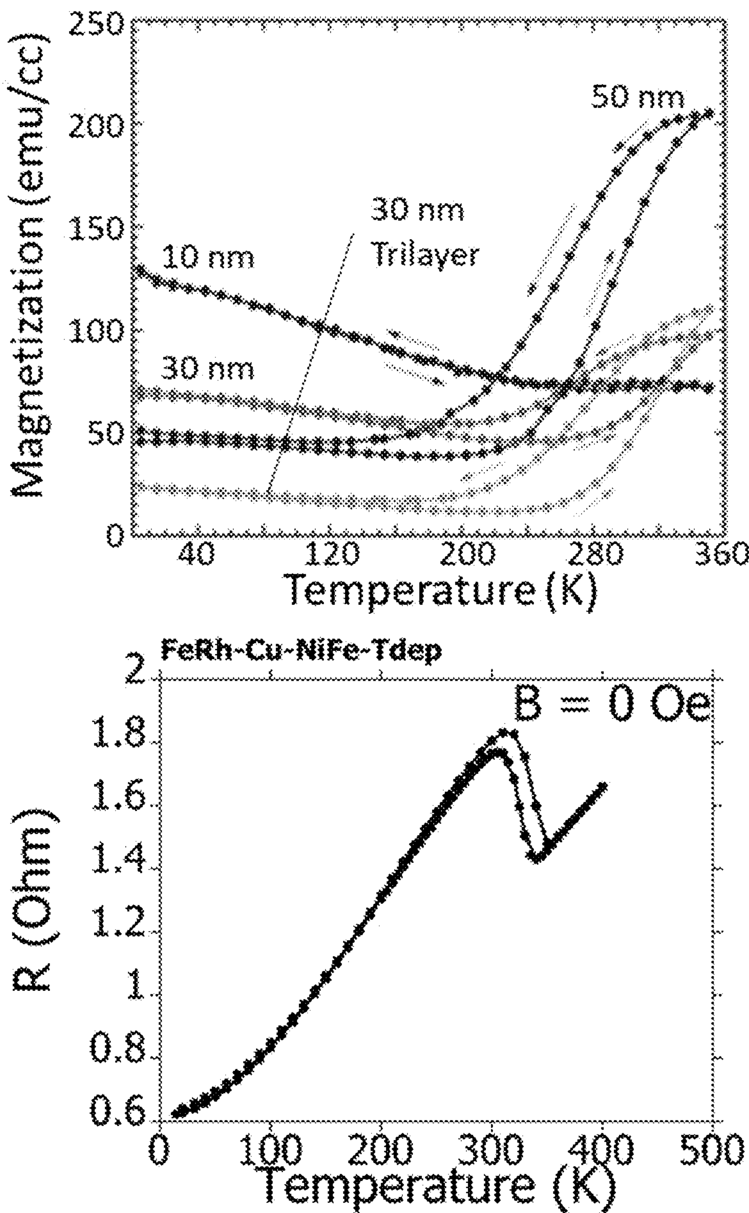
FIG. 3 illustrates Saturation magnetization curves as a function of temperature for FeRh(Pd) single layer films with 1 T applied field grown at 600° C. with varying thicknesses: 50 nm, 30 nm and 10 nm. Also illustrated is 4-point resistance of NRL grown FeRh film vs. Temperature. Arrows indicate the temperature sweep direction.
Figure 4:
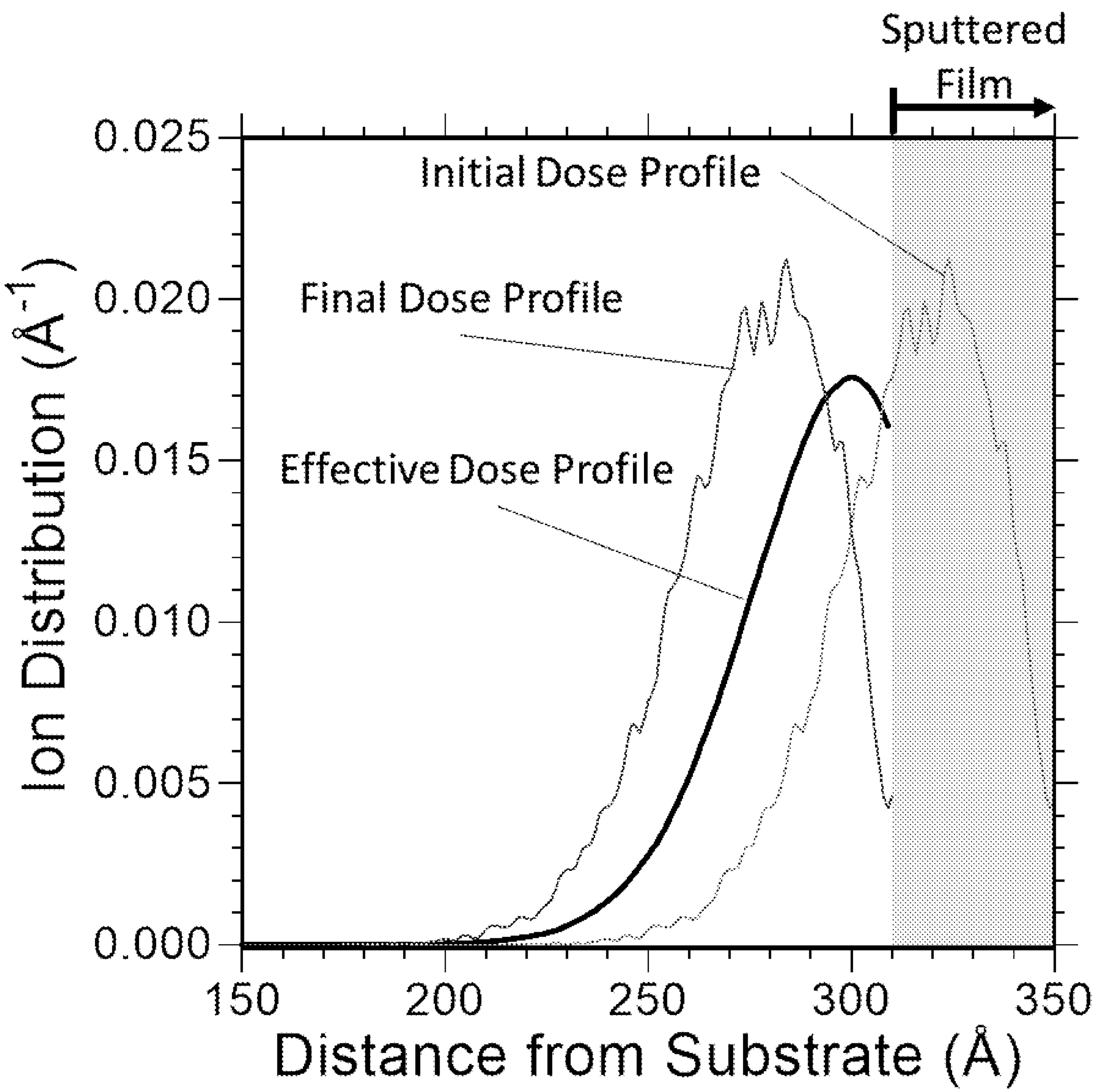
FIG. 4 illustrates instantaneous dose profile (IDP) and the effective dose profile (EDP) at the start of the processing and at the end of processing, respectively. The region in grey is the material that is sputtered during processing for 5 keV $Fe^{+}$ processing. Though some material is sputtered, the exchange bias is still formed.

FIG. 3 demonstrates the drastic change in magnetization (M) when an FeRh film is driven from its AFM phase to FM phase and back by temperature cycling of the sample. The magnetic phase exhibits hysteresis while temperature cycling the sample, as it takes more energy to change back from one phase to the other. This magnetic phase change is also seen in the temperature dependence of the resistance, since the spin dependent scattering in the AFM phase is higher than it is in the FM phase.

FIG. 3 shows the temperature dependent resistance of a NRL grown FeRh film, where a similar hysteresis is observed as in the magnetization versus temperature curve.

Example 2

Fabrication of FeRh Based Exchange Bias Layer

We experimentally demonstrated the use of an ion irradiated metamagnetic material as an exchange bias surface layer, using a sputtered FeRh film irradiated with Fe ions, and in a separate demonstration, irradiated with He ions.

Epitaxial films of FeRh were grown on MgO which yield a close lattice match with 45° rotation oriented parallel to the 100 cubic plane. Films were grown at a deposition temperature of 630° C. from 2" sputter targets at 75 W DC power. The films were then annealed in-situ to 730° C. to form FeRh's metamagnetic FCC—type L10 phase.

Fe ions were implanted at 5 keV using a modified Colutron G2 Ion gun with a $FeCl_2$ solid precursor as the source of Fe.

Based on Stopping and Range of Ions in Matter (SRIM) simulations, 5 keV Fe ions have a range of 3.5 nm and straggle (variance) of 2.0 nm leading to a total range of $Fe^+$ of 5.5 nm in FeRh with a density of 9.76 g/cm$^3$. With an atomic density of $7.4\times10^{22}$ atoms/cm$^3$, the $Fe^+$ dose used in the study of $7.4\times10^{15}$ $Fe^+$/cm$^2$ would increase the total number of atoms in the film by an equivalent amount as growing a 1 nm Fe film with an equivalent atomic density.

Concurrently, Transport of Ions in Matter (TRIM) simulations indicate a sputtering rate of 2.94 Fe and 1.99 Rh atoms per incident Fe ion. This suggests that, on average, there is a net loss of 2 Fe atoms (2.94 sputtered minus 1 implanted) and 2 Rh atoms. Therefore, the stoichiometry of the implanted portion of the film remains approximately unchanged.

For the total dose of $7.4\times10^{15}$ $Fe^{+}/cm^{2}$, there would be a net reduction of thickness of approximately 4 nm.

Assuming a constant sputtering rate, the effective normalized Fe ion distribution in the film following implantation can be solved based on the following equation:

$$EDP(x) = \int_{0}^{\Delta T} IDP\left(T - \left(x + \acute{T}\right)\right) d\acute{T}$$

where the Effective Dose Profile (EDP) is the effective ion distribution at a given location x, measured from the substrate, that accounts for the changing film thickness during implantation due to surface sputtering.

The film thickness, T, changes linearly with dose for a total reduction in thickness of $\Delta T$.

IDP is the instantaneous dose profile, measured from the film surface, and corresponds with the ion distribution that would result in the absence of sputtering. Therefore, this equation integrates the dose contributions at a given location x within the film as the IDP profile is translated from the surface of the film into the film a total distance of $\Delta T$.

Example 2

Figure 5:
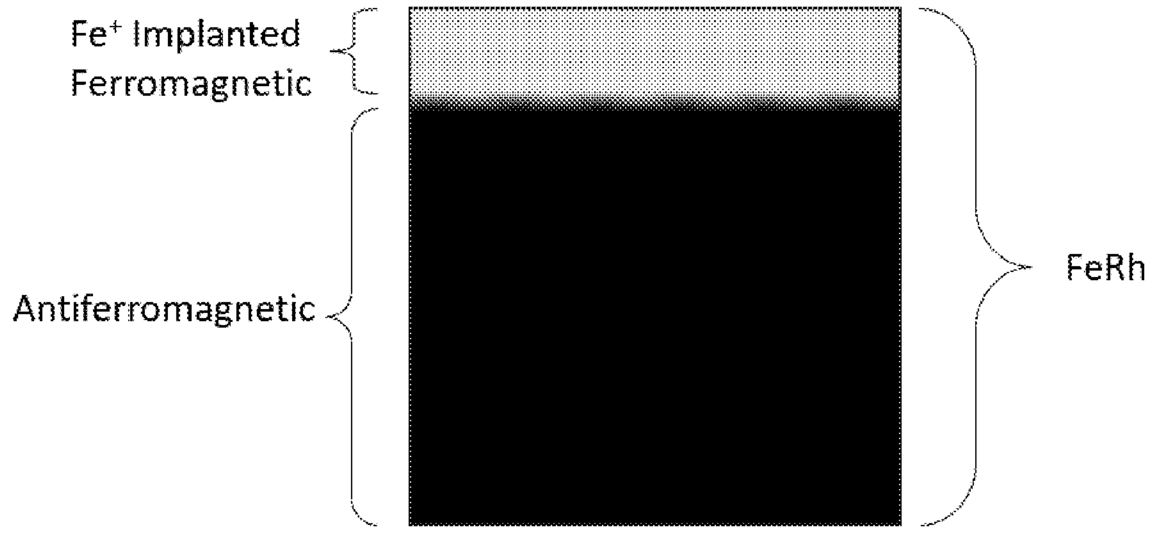
FIG. 5 illustrates FeRh film with Fe implanted region.

FIG. 5 illustrates the EDP and the initial and final IDP for the dose of $7.4\times10^{15}$ $Fe^{+}/cm^{2}$ 5 keV $Fe^{+}$.

This processing results in a structure where the top ~60 Å of the FeRh layer receives a significant Fe dose transitioning it to the FM state at RT while the bottom 250 Å remains in the AFM state, FIG. 5.

Since the approximately 2 atoms of Fe and 2 atoms of Rh are sputtered, the final film stoichiometry will remain approximately constant despite implanting a significant number of $Fe^{+}$.

Example 3

This discovery provides one with the unique ability to isotopically enrich the FeRh by implanting with the Fe isotope of choice.

For example, implanting with $^{57}Fe$ would significantly enhance its concentration in the film over the more abundant $^{54}Fe$ and $^{56}Fe$ that make up 5.85% and 91.75% of the film, respectively.

Instead of maintaining a fixed FeRh stoichiometry, $Fe^{+}$ ion energies can be reduced to increase the Fe/Rh sputtering ratio yielding a higher Rh concentration or increased to reduce the Fe/Rh sputtering ratio yielding a higher Fe concentration in the film.

Example 4

Processing FeRh with 1 keV $He^{+}$ ions produces a similar outcome as $Fe^{+}$ ions except that the range of $He^{+}$ is greater, extending to 200 Å into the film and there is only about 5.1 Å of sputtering for the dose $2\times10^{16}$ $He^{+}/cm^{2}$.

Figure 6:
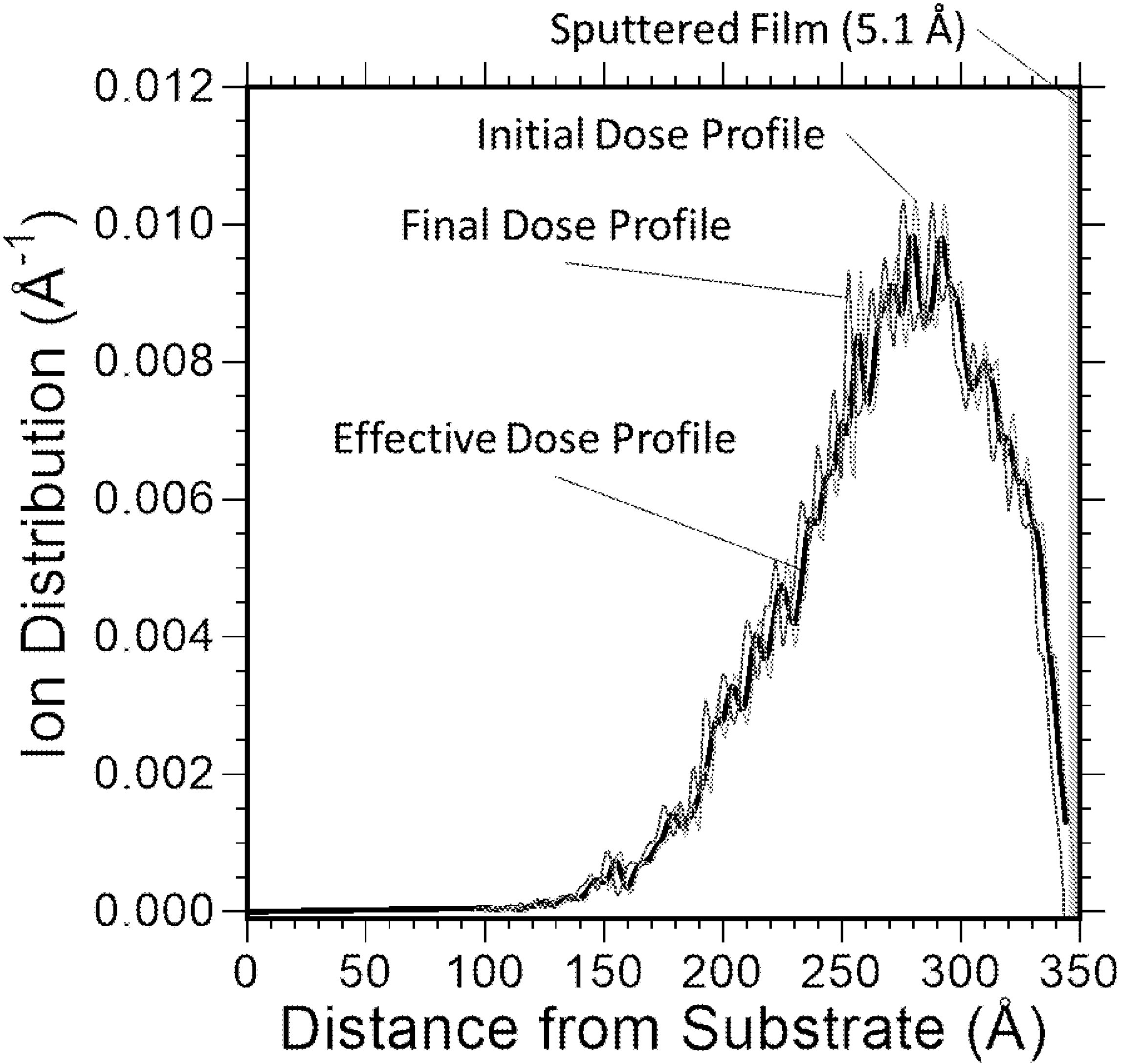
FIG. 6 illustrates IDP and EDP at the start of the processing and at the end of processing. The region in grey is the material that is sputtered during processing for 1 keV $He^{+}$ processing.
Figure 7:
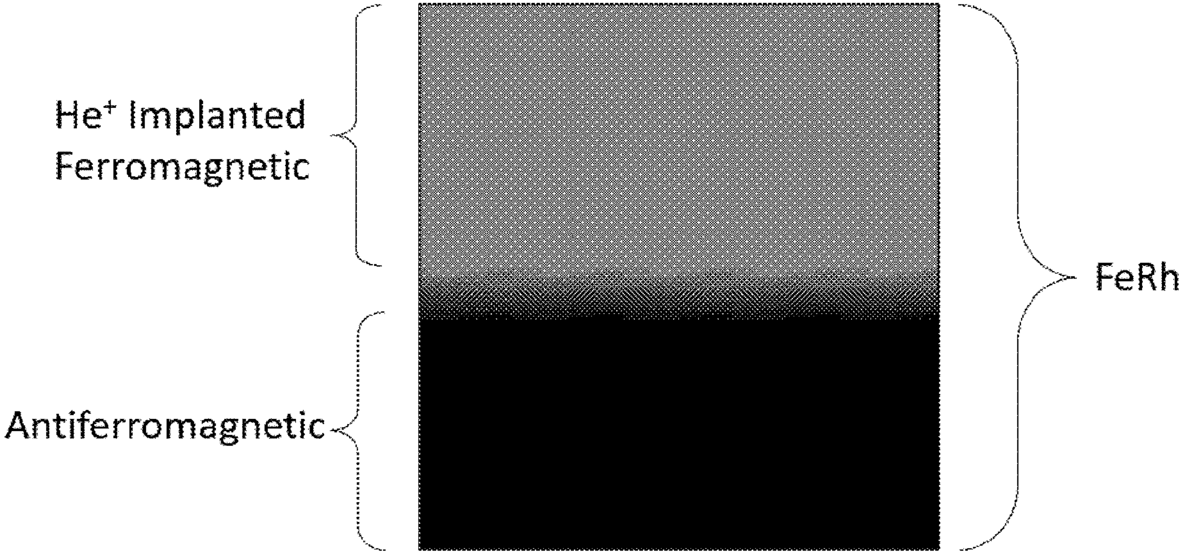
FIG. 7 illustrates FeRh film with He implanted region.

The EDP and IDP are shown in FIG. 6 and the processed portion of the film is depicted in FIG. 7.

Example 5

For samples processed with $Fe^{+}$ and $He^{+}$ the interface between the FM and AFM region is now inside a single layer of FeRh instead of between two dissimilar materials, ensuring the cleanest interface possible.

The origin of the FM region stems from displacements that occur during ion implantation. As illustrated in the figures, the depth and shape of this damage is highly tunable via the use of different ions, different energies, and combinations of ions and ion energies.

To set this exchange bias, one raises the temperature of the FeRh above the metamagnetic transition where the entire FeRh film becomes FM. Application of an external magnetic field results in the alignment of all the magnetic domains in the direction of the field. Cooling the film below the metamagnetic temperature causes the as-grown (bottom) part of the film to transition back to the AFM phase, yet since the ion implanted top region remains in the FM phase, the Neel vector of the AFM FeRh aligns with and becomes fixed in the direction of the magnetization in the FM region of the film. As a result, the top FM region of the film becomes exchanged bias to the bottom FeRh material in the AFM state.

Note, in a metallic antiferromagnet, such as the Mn alloys typically used in MTJs, one has to anneal the sample above the blocking temperature in a magnetic field. This blocking temperature is intrinsic to the alloy.

In contrast, the use of FeRh enables one to set the direction of the exchange bias be heating only to the metamagnetic transition temperature which is below 450 K.

Additionally, one can modify the metamagnetic transition by the dose and the species of ion irradiation allowing the exchange bias to persist well below room temperature (high doses) or only at elevated temperatures (low doses).

Example 6

Figure 8:
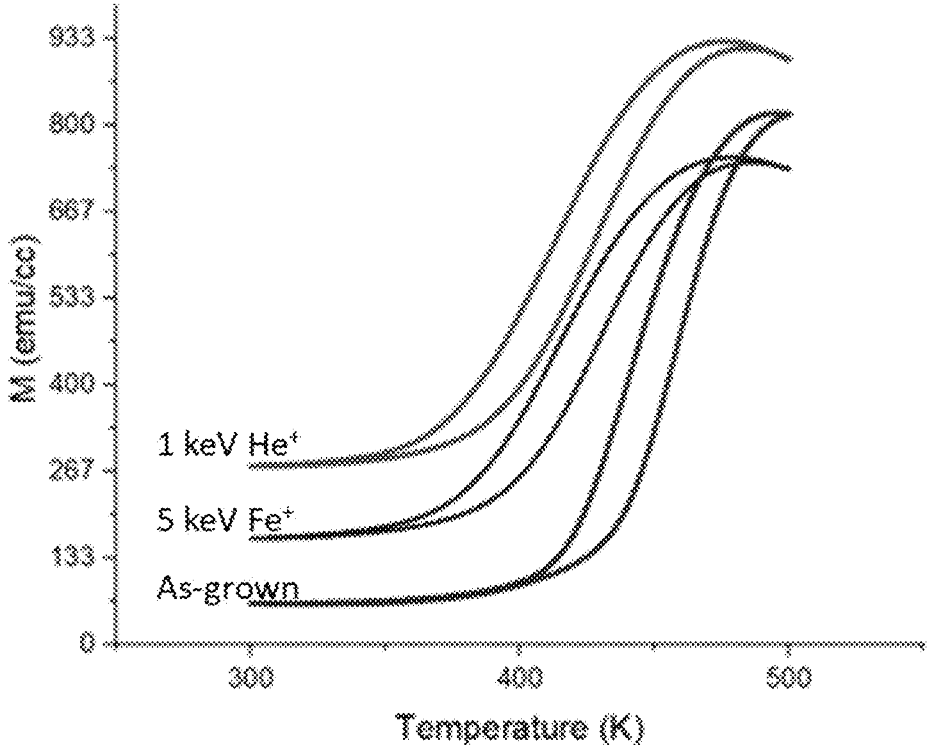
FIG. 8 illustrates Change in MvT for Fe and He processed FeRh.

FIG. 8 shows the impact of 5 keV $Fe^{+}$ and 1 keV $He^{+}$ processing on the temperature dependent magnetization behavior of 35 nm FeRh films in comparison to the as-grown film.

The as-grown film has low magnetization from 300 K to about 415 K before rapidly increasing due to the metamagnetic transition.

In comparison, both $Fe^{+}$ and $He^{+}$ processing increases the magnetization plateau below the metamagnetic transition.

Furthermore, the relative increase in magnetization scales in accordance with the depth of the effective dose profiles for $Fe^{+}$ and $He^{+}$ where the former reaches a depth of about 6 nm while the latter affected by Fe process compared with about 20 nm.

Despite having a considerable ion dose, the transition width of the remaining AFM material for the ion processed regions remains narrow and qualitatively the same as the as-grown material confirming that it is not impacted by the ions consistent with TRIM simulations.

Example 7

Figure 9:
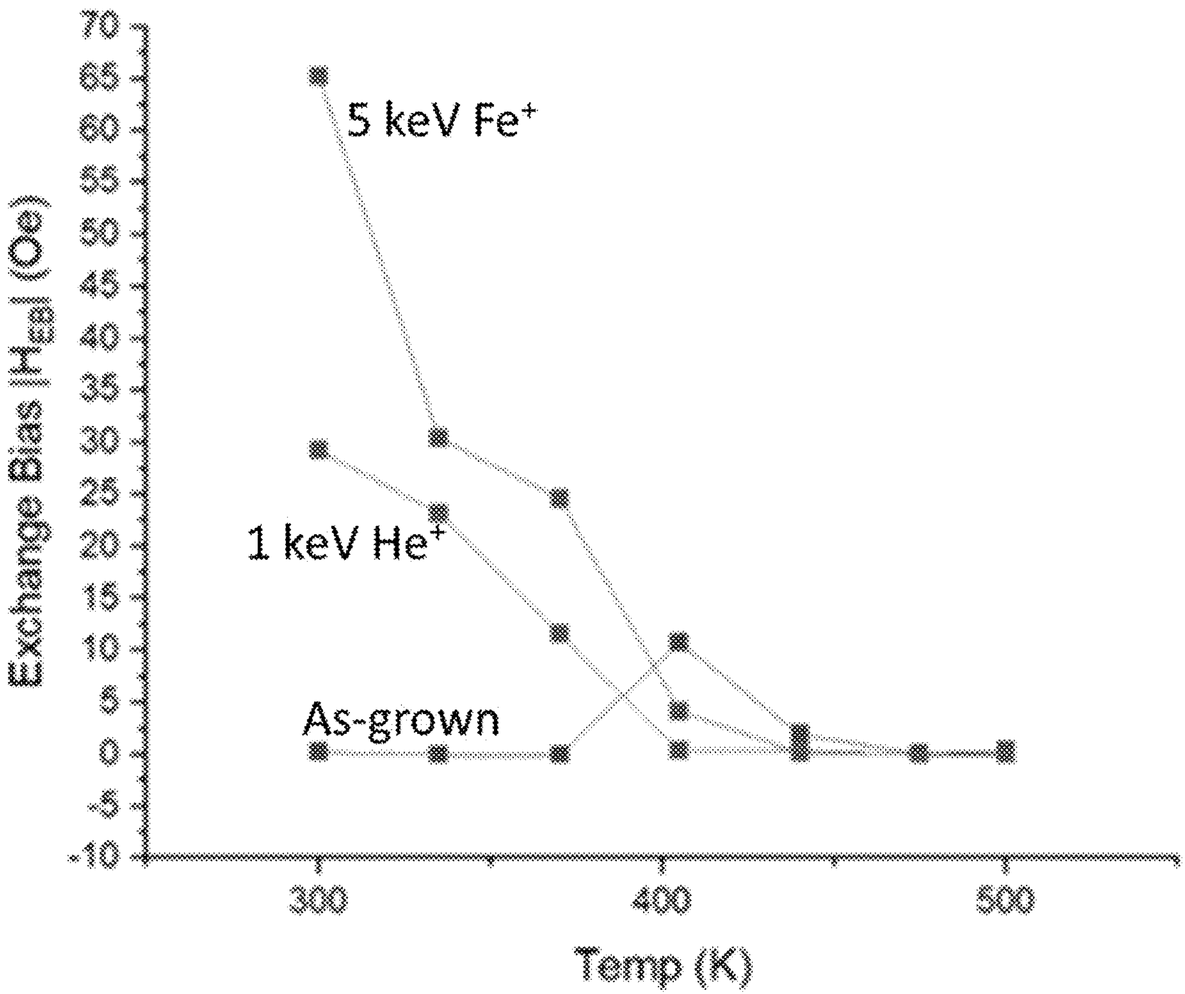
FIG. 9 illustrates Extracted exchange bias for as-grown, $Fe^+$, and $He^+$ processed films.
Figure 10:
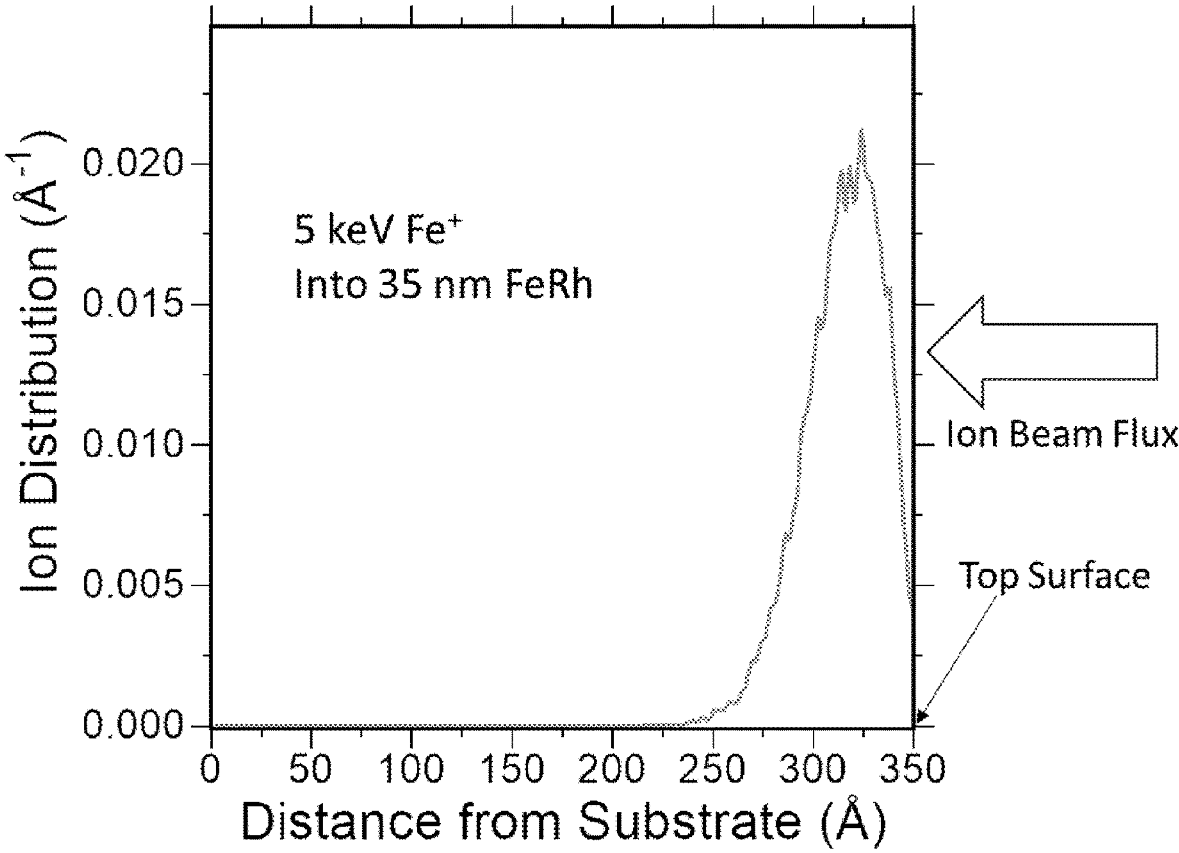
FIG. 10 illustrates ion distribution versus distance from the substrate.
Figure 11:
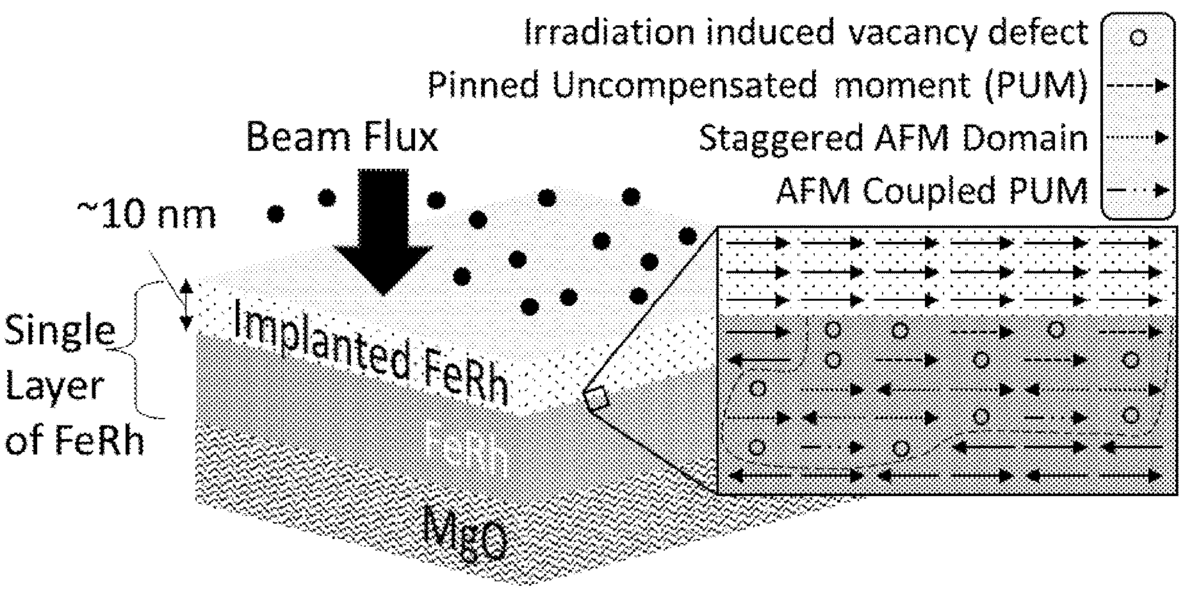
FIG. 11 illustrates a FM/AFM junction in a single layer of FeRh by implanting the surface of an FeRh film, which also achieves exchange bias of the FM region.

From FIG. 9, the magnitude of the exchange bias is plotted as a function of temperature. For the as grown sample, there is no exchange bias between 300-375 K or 425-500 K since the entire film is in the AFM or FM, respectively. At 400 K, a modest exchange bias of 10 Oe is measured and due to exchanged coupled domains that are randomly aligned within the film that form as the metamagnetic transition occurs.

In contrast, the $Fe^+$ and $He^+$ processed samples show no exchange bias at about 425 K and above, but a strong and increasing exchange bias as the sample is field cooled through the metamagnetic transition where the film has a top FM layer and bottom AFM layer.

The peak exchange bias for the $He^+$ processed sample is 30 Oe while it exceeds 65 Oe for $Fe^+$ processing which is attributed to the more abrupt EPD transition. In general, the magnetic properties of this single layer film exhibits all the properties normally associated with a multilayer stack of an AFM material and a FM material, such as PtMn/CoFe.

Also disclosed herein is a method that can reduce or enhance the temperature needed to set the exchange field.

We achieved this by controlling the radiation defect concentration. At low defect levels, the films didn't have exchange bias unless they are warmed up. At higher defect levels, the exchange bias persisted to lower temperatures, below room temperature. We controlled defect concentration levels in 2 ways. One, through the selection of ion, where heavy ions=higher defect concentration for the same fluence. Two, select different energies (the defect generation vs ion energy relationship is non-linear—it's a peaked function) so for low energy ions they have short range at a given damage level and we also use higher energy that yield a similar damage but at larger range.

Importantly, while reducing or enhancing the temperature needed to set the exchange field, we have taken advantage of the metamagnetic transition to set the exchange field.

A typical exchange bias requires the AFM/FM stack to be raised above the Neel temperature of the AFM material. At that temperature, the spins of the AFM become misaligned so that an external magnetic field can direct them. As a result, if the AFM/FM stack is cooled from above the Neel temperature with an external magnetic field, the spins at the interface between the AFM/FM layers gets pinned together and the exchange bias is formed.

In our material, the FeRh AFM region of the ion implanted film does not need to reach the Neel temperature. Instead, we can heat it to the metamagnetic transition temperature causing the entire film to become FM. Then upon field cooling, the spins are once again aligned and remain aligned as the lower portion of the film transitions to the AFM state, the surface of which remaining pinned at/near the interface of the top ion irradiated FM layer.

Example 8

The utility of a single-layer with an internal exchanged bias increases greatly when it is thermally stable to material processing steps that would be encountered during standard back end of line (BEOL) processing. To simulate a typical BEOL thermal exposure, $He^+$ and $Fe^+$ processed FeRh films were heated to 400° C. for 1 h then the procedure of field cooling to determine the exchange bias was repeated. These measurements once again yielded a peak exchange bias of 68 Oe after annealing confirming their stability to thermal cycling found in BEOL processing.

In contrast, the state of the art exchange layer in a magnetic memory element is composed of an antiferromagnetic layer, typically a Mn alloy and a FM layer, typically CoFe. The Mn causes reliability issues due to the ease of Mn diffusion through the stack at the annealing temperatures needed. Typically, the addition of a separate FM layer adds complexity and height to the memory cell, problems in the current art to overcome.

Charge-based devices for memory purposes are either fast and volatile (SRAM) or slow and non-volatile with limited repeatability ("Flash memory"). Other alternative memories, such as, resistance-based phase change materials (e.g. amorphous vs crystalline Ge) or ion movement in memristors, do not show the promise of scalability and embeddability that MRAM does. These represent other issues the current invention overcomes.

Some of the advantages of our new method, but not limited to, are that this new method reduces the number of layers used in an MTJ stack, thus simplifying the stack while also reducing the height of the stack.

One can control the metamagnetic transition at which the exchange bias starts by tuning the ion dose, energy, and ion species.

One can control the relative fraction of FM to AFM material within a film by tuning the ion dose, energy, and ion species.

Our method disclosed herein of inducing exchange bias by single step irradiation in a single FeRh film for use in a magnetic tunnel junction includes in another example creating near-interfacial pinned uncompensated moments, forming AFM regions near the interface with the FM region, and coupling antiferromagnetically the pinned uncompensated moments forming AFM domains aligned with the FM layer.

For one example, the single layer of metamagnetic material with exchange bias wherein the ion irradiation comprises about half the thickness of the single layer of FeRh.

The ion irradiation can be one selected from H+, N+, Ne+, Ar+, neutron irradiation, and electron irradiation.

The 5 keV $Fe^+$ irradiation penetrates about 100 Angstroms. The 1 keV He+ penetrates about 150 Angstroms. Other irradiation penetrates about 200 Angstroms. Irradiation can range from about 150-350 Angstroms.

Another example includes using implantation to enhance or effect or control the Fe^57 isotope fraction, and using the choice of ion energy to selectively enhance or reduce the Fe/Rh ratio in the implanted region of the film.

The origin of the FM region stems from displacements that occur during ion implantation. As illustrated in the figures, the depth and shape of this damage is highly tunable via the use of different ions, different energies, and combinations of ions and ion energies.

The use of FeRh enables one to set the direction of the exchange bias by heating only to the metamagnetic transition temperature which is below 450 K.

Additionally, one can modify the metamagnetic transition by the dose and the species of ion irradiation allowing the exchange bias to persist well below room temperature (high doses) or only at elevated temperatures (low doses).

The orientation of the exchange bias vector can be changed at the metamagnetic transition temperature rather than the Neel temperature which is much lower and avoids excessive thermal cycling to adjacent elements.

This device can be a "drop-in" replacement as a memory element in existing MRAM technology.

This alternative for Mn alloy/synthetic AFM exchange bias layers eliminates the reliability issues associated with Mn diffusion.

The locations and areal shapes of the FM/AFM regions are patterned at the same time they are created by the ion beam, which avoids the need for subsequent masking and etching.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms “including”, “includes”, “having”, “has”, “with”, or variants thereof are used in the detailed description and/or in the claims, such terms are intended to be inclusive in a manner similar to the term “comprising”.

What we claim is:

1. A method to create a FM/AFM interface in a single layer of FeRh, comprising the steps of:
- providing a layer of FeRh film;
  - wherein the layer of FeRh film has a top portion and a bottom portion;
  - wherein the layer of FeRh film is an antiferromagnetic (AFM) film;
- implanting ions into the top portion of the FeRh film;
- creating via the step of implanting ions a ferromagnetic (FM) region in the top region;
- controlling via ion mass the thickness of the top portion;
- maintaining the antiferromagnetic (AFM) region of the bottom portion; and
- creating a FM/AFM interface in the single layer of FeRh.

2. The method to create a FM/AFM interface in a single layer of FeRh of claim 1, further comprising the steps of:
- controlling via ion energy the thickness of the top portion.

3. A method of inducing exchange bias by single step irradiation in a single FeRh film for use in a magnetic tunnel junction, comprising the steps of:
- providing a layer of MgO;
- growing an Epitaxial film of FeRh on the layer of MgO;
- implanting ions;
- creating near-interfacial pinned uncompensated moments;
- forming AFM regions near the interface with the FM region; and
- coupling antiferromagnetically the pinned uncompensated moments forming AFM domains aligned with the FM layer.

4. The method of inducing exchange bias by single step irradiation in a single FeRh film for use in a magnetic tunnel junction of claim 3, further comprising the steps of:
- implanting ions to a depth of about 100 Angstroms to about 350 Angstroms in the FeRh or implanting to about half the thickness of the FeRh.

5. The method of inducing exchange bias by single step irradiation in a single FeRh film for use in a magnetic tunnel junction of claim 3, further comprising the steps of:
- providing a lattice match with 45° rotation oriented parallel to the 100 cubic plane;
- annealing in-situ the epitaxial films of FeRh on the MgO;
  - wherein the FeRh is in an AFM state; and
- forming a FeRh metamagnetic FCC—type L10 phase.

6. The method of inducing exchange bias by single step irradiation in a single FeRh film for use in a magnetic tunnel junction of claim 3, further comprising the steps of:
- utilizing Fe ions as the ions in the step of implanting ions.

7. The method of inducing exchange bias by single step irradiation in a single FeRh film for use in a magnetic tunnel junction of claim 3, further comprising the steps of:
- utilizing an ion gun with a $FeCl_2$ solid precursor as the source of Fe;
- implanting the Fe ions at 5 keV using the ion gun; and
- creating a Fe dose of $7.4\times10^{15}$ Fe/cm$^2$.

8. The method of inducing exchange bias by single step irradiation in a single FeRh film for use in a magnetic tunnel junction of claim 4, further comprising the steps of:
- creating a reduction of thickness of approximately 4 nm;
- transitioning a top ~60 Å of the FeRh layer to a FM state; and
- maintaining a bottom 250 Å of the FeRh layer in the AFM state.

9. The method of inducing exchange bias by single step irradiation in a single FeRh film for use in a magnetic tunnel junction of claim 4, further comprising the steps of:
- utilizing He ions as the ions in the step of implanting ions.

10. The method of inducing exchange bias by single step irradiation in a single FeRh film for use in a magnetic tunnel junction of claim 5, further comprising the steps of:
- creating a He dose of $2\times10^{16}$ He/cm$^2$; and
- transitioning a top ~200 Å of the FeRh layer to a FM state.

11. The method of inducing exchange bias by single step irradiation in a single FeRh film for use in a magnetic tunnel junction of claim 3, further comprising the steps of:
- enhancing the $Fe^{57}$ isotope fraction via the step of implanting ions; and
- controlling the Fe/Rh ratio in the ion implanted region of the film.

12. The method of inducing exchange bias by single step irradiation in a single FeRh film for use in a magnetic tunnel junction of claim 3, further comprising the steps of:
- setting the direction of the exchange bias by heating only to the metamagnetic transition temperature which is below 450 K.

13. The method of inducing exchange bias by single step irradiation in a single FeRh film for use in a magnetic tunnel junction of claim 3, further comprising the steps of:
- modifying the dose and the species of the step of implanting ions;
- modifying the metamagnetic transition;
- allowing the exchange bias to persist below room temperature for high doses or at elevated temperatures for low doses.

* * * * *